(12) United States Patent
Lee

(10) Patent No.: US 8,379,784 B2
(45) Date of Patent: Feb. 19, 2013

(54) SEMICONDUCTOR MEMORY DEVICE

(75) Inventor: Sang-Hee Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 702 days.

(21) Appl. No.: 12/005,841

(22) Filed: Dec. 28, 2007

(65) Prior Publication Data

US 2008/0310574 A1    Dec. 18, 2008

(30) Foreign Application Priority Data

Jun. 13, 2007    (KR) .................. 10-2007-0057727

(51) Int. Cl.
*H04L 7/00*    (2006.01)

(52) U.S. Cl. ......... 375/355; 375/373; 375/354; 375/371

(58) Field of Classification Search .................. 375/376, 375/373, 371, 354; 370/504; 714/12
See application file for complete search history.

(56) References Cited

U.S. PATENT DOCUMENTS

| | | | | |
|---|---|---|---|---|
| 5,822,255 A * | 10/1998 | Uchida | ............... | 365/194 |
| 5,841,717 A * | 11/1998 | Yamaguchi | ............... | 365/205 |
| 6,020,776 A | 2/2000 | Young | | |
| 6,430,696 B1 * | 8/2002 | Keeth | ............... | 713/503 |
| 6,573,771 B2 * | 6/2003 | Lee et al. | ............... | 327/158 |
| 6,816,416 B2 | 11/2004 | Won | | |
| 6,987,705 B2 | 1/2006 | Kim et al. | | |
| 7,043,672 B2 | 5/2006 | Merritt | | |
| 7,130,367 B1 * | 10/2006 | Fu et al. | ............... | 375/376 |
| 7,400,181 B2 * | 7/2008 | Metz et al. | ............... | 327/149 |
| 7,940,072 B2 * | 5/2011 | Suda | ............... | 324/762.01 |
| 2001/0014922 A1 * | 8/2001 | Kuge | ............... | 710/36 |
| 2003/0067331 A1 * | 4/2003 | Drexler | ............... | 327/158 |
| 2004/0243961 A1 | 12/2004 | Iadonato et al. | | |
| 2005/0034006 A1 | 2/2005 | Schoenfeld et al. | | |
| 2006/0193195 A1 * | 8/2006 | Hur et al. | ............... | 365/233 |
| 2006/0209620 A1 * | 9/2006 | Deivasigamani et al. | .... | 365/233 |
| 2007/0075759 A1 * | 4/2007 | Metz et al. | ............... | 327/158 |
| 2007/0121394 A1 * | 5/2007 | Noda et al. | ............... | 365/194 |
| 2008/0001642 A1 * | 1/2008 | Yun et al. | ............... | 327/161 |
| 2009/0080272 A1 * | 3/2009 | Lee et al. | ............... | 365/194 |

FOREIGN PATENT DOCUMENTS

| | | |
|---|---|---|
| JP | 06-209243 | 7/1994 |
| JP | 2001-028200 A | 1/2001 |
| JP | 2002-185313 A | 6/2002 |
| JP | 2004-246958 | 9/2004 |
| JP | 2005-038526 | 2/2005 |
| JP | 2005-318520 A | 11/2005 |

* cited by examiner

*Primary Examiner* — Shuwang Liu
*Assistant Examiner* — Helene Tayong
(74) *Attorney, Agent, or Firm* — Blakely, Sokoloff, Taylor & Zafman

(57) ABSTRACT

A semiconductor memory device stably performs a read operation at a high frequency, thereby reducing a current consumption. The semiconductor memory device is capable of performing the read operation stably by controlling a data eye. The semiconductor memory device includes an output unit and a data eye control unit. The output unit outputs data in synchronization with clock signals. The data eye control unit controls a data eye of the data output by the output unit.

16 Claims, 4 Drawing Sheets

Data Fighting Period(Δ)→Deteriorating DATA EYE

Controlling the pulse width (A and B)→Improving DATA EYE

SEMICONDUCTOR MEMORY DEVICE

CROSS-REFERENCE TO RELATED APPLICATIONS

The present invention claims priority to Korean patent application number. 10-2007-0057727, filed on Jun. 13, 2007, which is incorporated by reference in its entirety.

BACKGROUND OF THE INVENTION

The present invention relates to a semiconductor memory device, and more particularly to a read operation performed by the semiconductor memory device.

As a semiconductor memory device operates at a high frequency, it is more important for the semiconductor memory device to perform a read operation stably. Generally, the semiconductor memory device such as a double data rate (DDR) DRAM performs the read operation through a data output circuit. The data output circuit processes the data in synchronization with a clock signal outputted from a delay locked loop (DLL) circuit.

FIG. 1 is a block diagram illustrating a read path of a conventional DDR DRAM. The read path is provided with a clock buffer 10, a DLL circuit 20, a pulse generator 30, a pre driver 40, and a main driver 50.

The clock buffer 10 buffers an external clock ECLK, thereby generating an internal clock ICLK. The DLL circuit 20 performs a delay locking operation on the internal clock ICLK, thereby generating a rising clock RCLKDLL and a falling clock FCLKDLL. The pulse generator 30 generates pulse type signals through nodes A and B in response to the rising and falling clocks RCLKDLL and FCLKDLL, respectively. The pre driver 40 outputs data DATA0/DATA1 outputted from a pipe register, not shown, in synchronization with the pulse type signal. The main driver 50 outputs data DQ to external devices according to an output of the pre driver 40.

The read operation according to the read path in FIG. 1 is described below.

After the data DATA0/DATA1 are transmitted from the pipe register to the pre driver 40, an output timing of the data DATA0/DATA1 from the pre driver 40 is determined by the clocks outputted from the DLL circuit 20. That is, an even number of data DATA0 is outputted in response to the rising clock RCLKDLL and an odd number of data DATA1 is outputted in response to the falling clock FCLKDLL. In more detail, the data DATA0/DATA1 are outputted in response to the pulse type signal which is generated by the pulse generator 30 in response to the rising and falling clocks RCLKDLL and FCLKDLL.

The pulse generator 30 generates a pulse signal having a predetermined pulse width in order to transmit the data without fail. Accordingly, as the semiconductor memory device operates at a high frequency, the pulse width of the pulse signal becomes bigger than the half of that of the external clock. In that case, all of the transmission gates 402, 404, 406 and 408 in the pre driver 40 are open for a certain interval. At that time, if the data DATA0/DATA1 have different logic levels, i.e., logic high and low levels, respectively, there is a data fighting. At the data fighting, the output level of the pre driver 40 is pulled to one of two different data levels, depending on which has more driving ability. As a result, the data have different data eyes as described in FIG. 2.

FIG. 2 is a signal timing diagram illustrating the data eye according to the read path in FIG. 1. For example, the data fighting occurs when the even number of data DATA0 and the odd number of data DATA1 have logic high and low levels, respectively, and the enablement period of pulse signals on nodes A and B overlap with each other. If the logic low level has more driving ability than the logic high level, that is, a voltage supplying the logic low level has more power than the other, a data eye of the even number of data DATA0 decreases and a data eye of the odd number of data DATA1 increases. Accordingly, the semiconductor memory device cannot perform a data output operation stably and a malfunction is caused. In addition, current consumption increases by the data fighting.

SUMMARY OF THE INVENTION

Embodiments of the present invention are directed to providing a semiconductor memory device for stably performing a read operation at a high frequency by controlling a data eye, thereby reducing a current consumption during the read operation.

In one embodiment, a semiconductor memory device includes an output unit for outputting data in synchronization with clock signals, and a data eye control unit for controlling a data eye of the data output by the output unit.

In another embodiment, a method for driving a semiconductor memory device includes performing a delay locking operation on an internal clock, thereby generating delay locked clocks, controlling a data eye of the data, and outputting the data in synchronization with the delay locked clocks.

DESCRIPTION OF SPECIFIC EMBODIMENTS

A semiconductor memory device of the present invention is capable of stably performing a read operation even at high frequency, thereby reducing a current consumption. The semiconductor memory device is also able to control a data eye during the read operation, thereby reducing the current consumption with a stable read operation.

Hereinafter, an impedance matching circuit in accordance with the present invention will be described in detail referring to the accompanying drawings.

Figure 1:
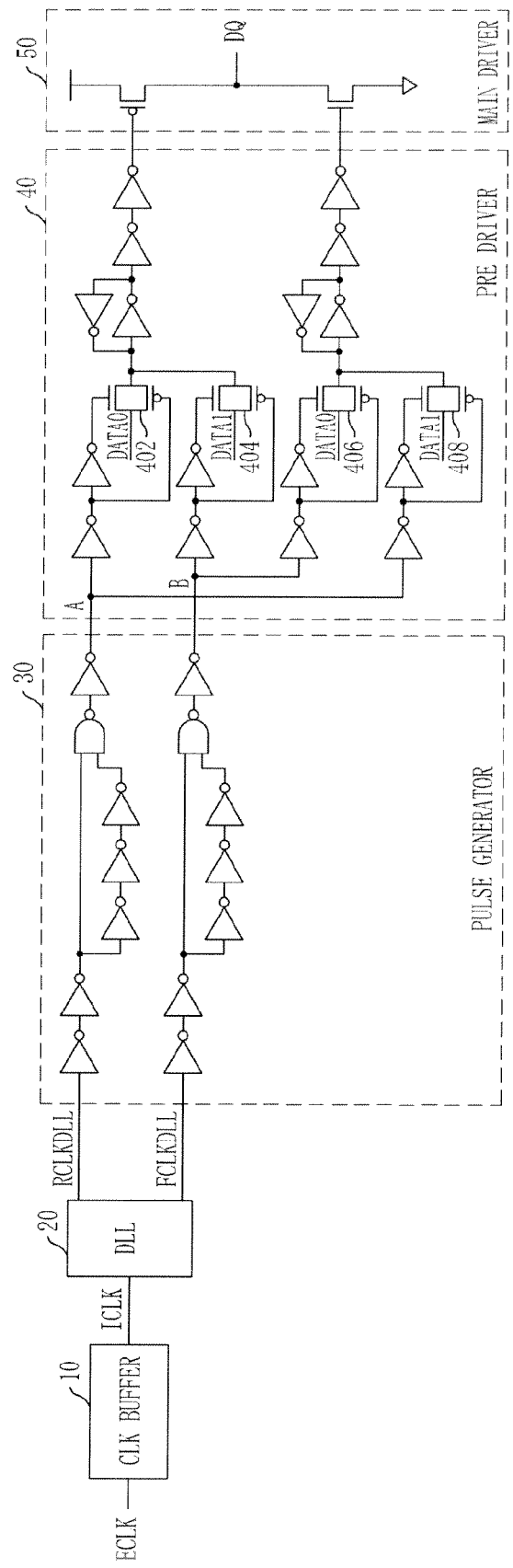
FIG. 1 illustrates a block diagram of a read path of a conventional DDR DRAM.
Figure 2:
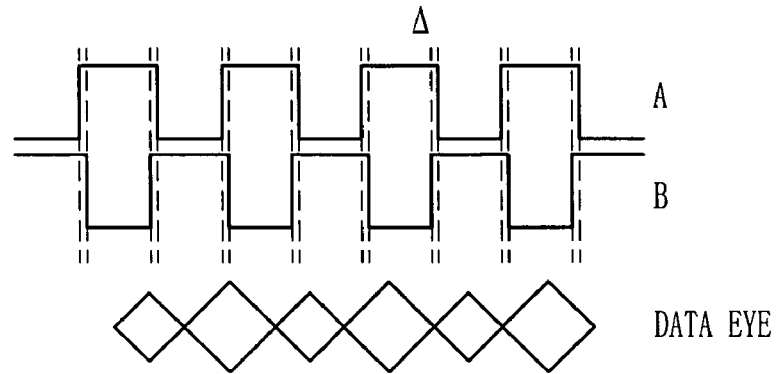
FIG. 2 illustrates a signal timing diagram of a data eye according to the read path in FIG. 1.
Figure 3:
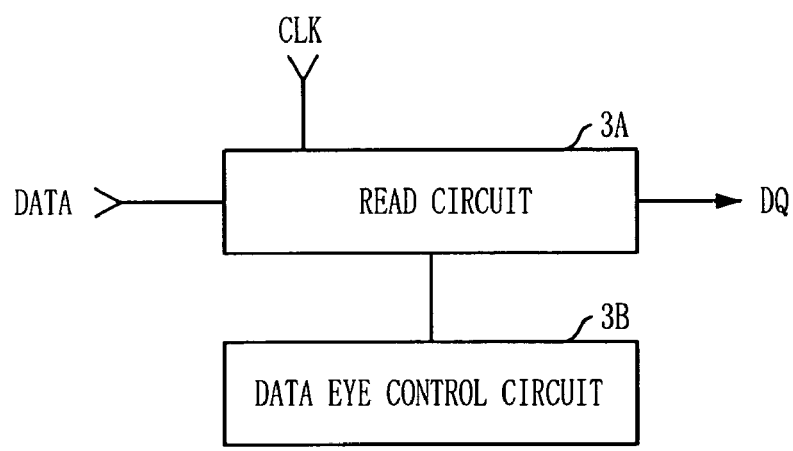
FIG. 3 illustrates a block diagram of a semiconductor memory device in accordance with the present invention.

FIG. 3 is a block diagram illustrating a semiconductor memory device in accordance with the present invention. The semiconductor memory device includes a read circuit 3A and a data eye control circuit 3B. The read circuit 3A outputs data DATA in synchronization with a clock CLK. The data eye control circuit 3B controls a data eye of an output of the read circuit 3A to be kept constant.

The semiconductor memory device may further include a clock buffer and a DLL circuit. The clock buffer buffering an external clock generates an internal clock to the read circuit 3A. The DLL circuit generates delay locked clocks to the read circuit 3A in response to the internal clock.

A pipe register is further provided to the semiconductor memory device. The pipe register may be included in the read circuit 3A, i.e., in the field of that, by those skilled in the art, so that it transmits the data.

The read circuit 3A includes a pulse generator, a pre driver and a main driver, thereby performing a data read operation. The pulse generator generates a pulse signal corresponding to the delay locked clocks which consist of rising and falling clocks. The pre driver outputs the data DATA in synchronization with the pulse signal. The main driver outputs data DQ to external devices according an output of the pre driver 40.

The data eye control circuit 3B includes a delay tuning unit and a phase detector. The delay tuning unit synchronizes the internal clock with the delay locked clocks, thereby supplying the synchronized signals to the phase detector. The phase detector detects the phases of outputs of the delay tuning unit. The delay tuning unit may perform the synchronization operation on a signal derived from the delay locked clocks. Accordingly, it is desirable to synchronize the pulse signal of the pulse generator with the internal clock, which is described as an embodiment of the present invention.

The semiconductor memory device in accordance with the present invention controls the data eye of the output of the read circuit 3A according to the phase detection, thereby performing the read operation stably. In a preferable embodiment of the present invention, it is provided that the pulse signal of the pulse generator is controlled according to the phase detection. While it is only a particular embodiment, the present invention may be embodied in various manners. Besides the pulse signal, the delay locked clock can be directly controlled according to the phase detection. In accordance with the present invention, one preferable embodiment is described below.

Figure 4:
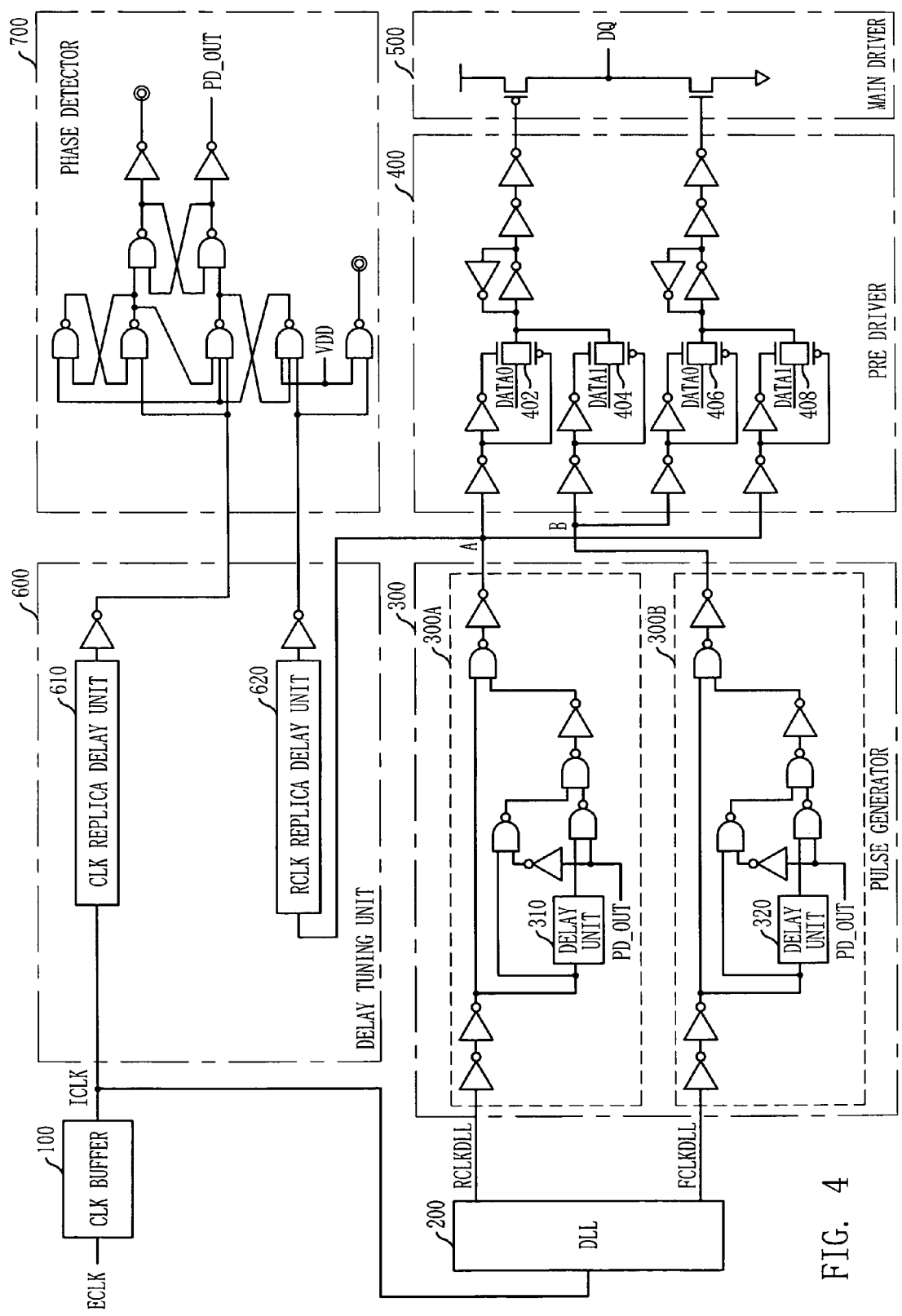
FIG. 4 illustrates a schematic circuit diagram of a semiconductor memory device in accordance with a preferable embodiment of the present invention.

FIG. 4 is a schematic circuit diagram illustrating a semiconductor memory device in accordance with a preferable embodiment of the present invention. The semiconductor memory device includes a clock buffer 100, a DLL circuit 200, a pulse generator 300, a pre driver 400, a main driver 500, a delay tuning unit 600 and a phase detector 700.

The clock buffer 100 buffers an external clock ECLK, thereby generating an internal clock ICLK. The DLL circuit 200 performs a delay locking operation on the internal clock ICLK, thereby generating a rising clock RCLKDLL and a falling clock FCLKDLL. The pulse generator 300 generates pulse signals through nodes A and B in response to the rising and falling clocks RCLKDLL and FCLKDLL, respectively. The pre driver 400 outputs data DATA0/DATA1 outputted from a pipe register, not shown, in synchronization with the pulse signal. The main driver 500 outputs data DQ to external devices according to an output of the pre driver 400. The delay tuning unit 600 synchronizes the internal clock ICLK with the pulse signal. The phase detector 700 detects the phases of outputs of delay tuning unit 600, thereby generating a phase detection signal PD_OUT.

The pulse generator 300 for generating the pulse signals corresponding to the rising and falling clocks RCLKDLL and FCLKDLL controls delaying the rising and falling clocks RCLKDLL and FCLKDLL in response to the phase detection signal PD_OUT. The pulse generator 300 includes a first and a second pulse generating units 300A and 300B.

The first pulse generating unit 300A generates a rising pulse signal corresponding to the rising clock RCLKDLL through the node A by delaying the rising clock RCLKDLL in response to the phase detection signal PD_OUT. The second pulse generating unit 300B generates a falling pulse signal corresponding to the falling clock FCLKDLL through the node B by delaying the falling clock FCLKDLL in response to the phase detection signal PD_OUT. The rising and falling clocks RCLKDLL and FCLKDLL are delayed in response to the phase detection signal PD_OUT. The delay timing is determined according to delay units 310 and 320, respectively. The rising and falling clocks RCLKDLL and FCLKDLL are controlled in response to the phase detection signal PD_OUT, respectively.

The delay tuning unit 600 synchronizes the internal clock ICLK with the pulse signal. Referring to FIG. 4, the delay tuning unit 600 uses the rising pulse signal of the pulse signals, however it can be different according to the embodiment. The delay tuning unit 600 includes a CLK replica delay 610 for delaying the internal clock ICLK, and a RCLK replica delay 620 for delaying the rising pulse signal outputted from node A. The phase detector 700 detects the phases of the CLK replica delay unit 610 and the RCLK replica delay unit 620.

The operation performed by the semiconductor memory device in FIG. 4 is described below.

In accordance with the present invention, a signal derived from a system clock is compared with a signal derived from an output signal of the DLL circuit. As a result, a signal which is provided to the pre driver in the read circuit is controlled. Therefore, the data eye of the output data is kept to be constant.

In particular, the internal clock ICLK is compared with the rising pulse signal of the pulse generator 300, referring to the semiconductor memory device in FIG. 4. Before the comparison, the replica delay units 610 and 620 synchronize a rising edge of the internal clock ICLK with that of a rising pulse signal. These synchronized signals are inverted by inverters and inputted to the phase detector 700. And then, it is detected whether a pulse width of the rising pulse signal is bigger than the half of the pulse width of the system clock, i.e., the half of tCK, or not.

If the pulse width of the rising pulse signal is bigger than the half, the phase detector 700 outputs the phase detection signal PD_OUT at a logic low level. Otherwise, the phase detector 700 outputs the phase detection signal PD_OUT at a logic high level. The phase detection signal PD_OUT is a feedback signal inputted to the delay units 310 and 320 in the pulse generator 300, in order to determine the pulse width of the pulse signal. Accordingly, it is prevented that the pulse signals enabled at a logic high level are outputted through nodes A and B at the same time. Consequently, it is prevented for transmission gates 402, 404, 406 and 408 of the pre drive 400 from turning on at the same time even when operating at a high frequency.

If the data DATA0/DATA1 have different logic levels, i.e., logic high and low levels, respectively, data fighting occurs in the conventional semiconductor memory device. Characteristics with respect to the data eye are deteriorated and current consumption increases. However, in accordance with the present invention, it is prevented that the enablement period of the pulse signals is overlapped with each other at high frequency. There is no data fighting caused in the pre driver 400. Accordingly, current consumption by a direct current decrease and gains on characteristics with respect to the data eye increase by a predetermined value $\Delta$.

Figure 5:
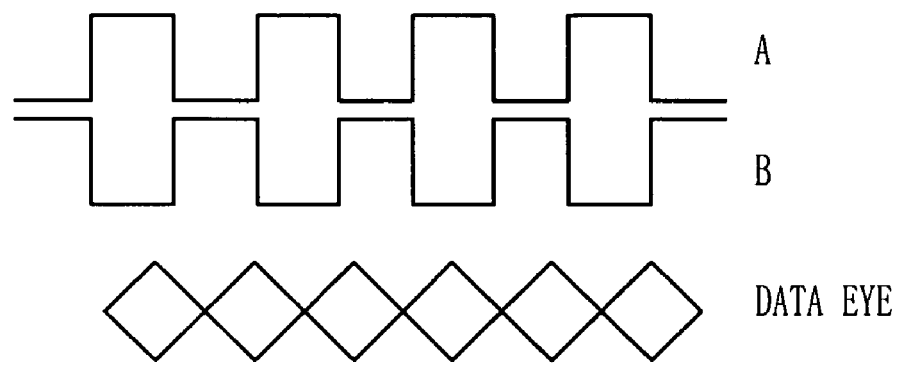
FIG. 5 illustrates a signal timing diagram of a data eye according to the semiconductor memory device in FIG. 3.

FIG. 5 is a signal timing diagram illustrating a data eye according to the semiconductor memory device in FIG. 3. It shows gains on characteristics with respect to the data eye without overlaps of the pulse signal enabled on nodes A and B.

The semiconductor memory device is described in the particular embodiment of the present invention. However it may be applied to general semiconductor integrated circuits that the characteristics with respect to the data eye can be improved with respect to phase detection and the feedback control.

While the present invention has been described with respect to the particular embodiments, it will be apparent to those skilled in the art that various changes and modifications may be made without departing from the spirit and scope of the invention as defined in the following claims.

What is claimed is:
1. A semiconductor memory device, comprising:
   an output unit for outputting data in synchronization with clock signals; and
   a data eye control unit for detecting phases of an internal clock and pulse signals corresponding to delay locked clocks as the clock signals, and controlling pulse widths of the clock signals based on the detection result so as to control a data eye of the data output by the output unit,
wherein the data eye control unit includes:
a delay tuning unit for synchronizing the internal clock with the pulse signals and outputting the synchronized internal clock and the synchronized pulse signals; and
a phase detector for detecting phases of the synchronized internal clock and the synchronized pulse signals which are outputted from the delay tuning unit, and outputting a phase detection result to the output unit so as to adjust pulse widths of the pulse signals.

2. The semiconductor memory device of claim 1, further comprising:
a clock buffer for buffering an external clock, thereby generating the internal clock; and
a delay locked loop (DLL) circuit for performing a delay locking operation on the internal clock, thereby generating the delay locked clocks as the clock signals.

3. The semiconductor memory device of claim 1, further comprising a pipe register for supplying the data to the output unit.

4. The semiconductor memory device of claim 2, wherein the output unit includes:
a pulse generator for generating the pulse signals corresponding to the delay locked clocks in response to the phase detection result;
a pre driver for outputting the data in synchronization with the pulse signals; and
a main driver for outputting data corresponding to outputs of the pre driver.

5. The semiconductor memory device of claim 4, wherein the delay locked clocks include a rising clock and a falling clock.

6. The semiconductor memory device of claim 1, wherein the pulse generator adjusts pulse widths of the pulse signals according to the result of phase detection from the phase detector.

7. The semiconductor memory device of claim 1, wherein the delay tuning unit comprises:
a first replica delay unit configured to delay the internal clock; and
a second replica delay unit configured to delay the pulse signals.

8. The semiconductor memory device of claim 7, wherein the first replica delay unit delays the internal clock and the second replica delay unit delays the pulse signals to synchronize rising edges of the internal clock and the pulse signals to generate the synchronized internal clock and the synchronized pulse signals, respectively, wherein the output synchronized internal clock and the synchronized pulse signals are inverted prior to being output to the phase detector.

9. The semiconductor memory device of claim 8, wherein the phase detector adjusts pulse widths of the pulse signals by detecting whether a pulse width of the synchronized pulse signals is bigger than half a pulse width of the synchronized internal clock and outputs the phase detection result at a logic low level when the pulse width of the synchronized pulse signals is bigger than half the pulse width of the synchronized internal clock.

10. A semiconductor memory device, comprising:
a clock buffer configured to receive and buffer an external clock, and generate an internal clock;
a delay locked loop (DLL) circuit configured to perform a delay locking operation on the internal clock, and generate delay locked clocks;
an output unit configured to output data in synchronization with the delay locked clocks; and
a data eye control unit configured to detect phases of the internal clock and the delay locked clocks, and control the delay locked clocks based on the detecting result so as to control a data eye of the data output by the output unit,
wherein the data eye control unit comprises:
a delay tuning unit configured to receive the internal clock and pulse signals corresponding to the delay locked clocks, synchronize the internal clock with the pulse signals, and output the synchronized internal clock and the synchronized pulse signals; and
a phase detector configured to receive the synchronized internal clock and the pulse signals which are outputted from the delay tuning unit, detect phases of the synchronized internal clock and the synchronized pulse signals, and output a phase detection result to the pulse generator so as to adjust pulse widths of the pulse signals.

11. The semiconductor memory device of claim 10, wherein the output unit comprises:
a pulse generator configured to generate pulse signals corresponding to the delay locked clocks in response to the phase detection result;
a pre driver configured to output the data in synchronization with the pulse signals; and
a main driver configured to output data corresponding to outputs of the pre driver.

12. The semiconductor memory device of claim 10, wherein the delay locked clocks include a rising clock and a falling clock.

13. The semiconductor memory device of claim 10, wherein the delay tuning unit receives the pulse signals corresponding to the rising clock.

14. The semiconductor memory device of claim 10, wherein the delay tuning unit comprises:
a first replica delay unit configured to delay the internal clock; and
a second replica delay unit configured to delay the pulse signals.

15. The semiconductor memory device of claim 14, wherein the first replica delay unit delays the internal clock and the second replica delay unit delays the pulse signals to synchronize rising edges of the internal clock and the pulse signals to generate the synchronized internal clock and the synchronized pulse signals, respectively, wherein the output synchronized internal clock and the synchronized pulse signals are inverted prior to being output to the phase detector.

16. The semiconductor memory device of claim 15, wherein the phase detector adjusts pulse widths of the pulse signals by detecting whether a pulse width of the synchronized pulse signals is bigger than half a pulse width of the synchronized internal clock and outputs the phase detection result at a logic low level when the pulse width of the synchronized pulse signals is bigger than half the pulse width of the synchronized internal clock.

* * * * *